United States Patent
Bianchi (10) Patent No.: US 12,388,163 B2
(45) Date of Patent: Aug. 12, 2025

(54) DIRECTIONAL COUPLER ARRANGEMENT

(71) Applicant: Advantest Corporation, Tokyo (JP)

(72) Inventor: Giovanni Bianchi, Ehningen (DE)

(73) Assignee: Advantest Corporation, Tokyo (JP)

( * ) Notice: Subject to any disclaimer, the term of this patent is extended or adjusted under 35 U.S.C. 154(b) by 320 days.

(21) Appl. No.: 17/721,925

(22) Filed: Apr. 15, 2022

(65) Prior Publication Data

US 2022/0238979 A1 Jul. 28, 2022

Related U.S. Application Data

(63) Continuation of application No. PCT/EP2020/081978, filed on Nov. 12, 2020.

(51) Int. Cl.
  *H01P 5/18* (2006.01)
  *H01P 5/02* (2006.01)

(52) U.S. Cl.
  CPC . *H01P 5/18* (2013.01); *H01P 5/02* (2013.01)

(58) Field of Classification Search
  CPC ..................................... H01P 5/18; H01P 5/02
  See application file for complete search history.

(56) References Cited

U.S. PATENT DOCUMENTS

| | | |
|---|---|---|
| 2014/0266499 A1 | 9/2014 | Noe |
| 2016/0079649 A1 | 3/2016 | Ilkov et al. |
| 2016/0079650 A1 | 3/2016 | Solomko et al. |
| 2017/0063425 A1 | 3/2017 | Khlat et al. |
| 2017/0324392 A1* | 11/2017 | Srirattana ............... H01P 5/185 |
| 2018/0048046 A1* | 2/2018 | Noguchi ................. H03H 7/48 |
| 2019/0237843 A1 | 8/2019 | Hanaoka |

FOREIGN PATENT DOCUMENTS

CN 105428773 3/2016

* cited by examiner

*Primary Examiner* — Samuel S Outten
(74) *Attorney, Agent, or Firm* — Artegis Law Group, LLP (57) ABSTRACT

A directional coupler arrangement, comprising: a directional coupler comprising a direct path and a first coupled port and a second coupled port; a compensation arrangement configured to provide a coupling between signals of the first coupled port and of the second coupled port; wherein the compensation arrangement is configured to improve a directivity when compared to a directivity of the directional coupler by the coupling.

7 Claims, 8 Drawing Sheets

DIRECTIONAL COUPLER ARRANGEMENT

CROSS-REFERENCES TO RELATED APPLICATIONS

This application is a continuation of copending International Application No. PCT/EP2020/081978, filed Nov. 12, 2020, which is incorporated herein by reference in its entirety.

TECHNICAL FILED

Embodiments according to the invention are related to a directional coupler arrangement for increasing a directivity of the directional coupler. Some embodiments according to the invention are related to a method for operating a directional coupler arrangement.

BACKGROUND OF THE INVENTION

Directional couplers are most frequently constructed from two coupled transmission lines set close enough together such that energy passing through one is coupled to the other. This technique is favoured at the microwave frequencies where transmission line designs are commonly used to implement many circuit elements. Directional couplers have many applications, e.g. providing a signal sample for measurement or monitoring, feedback, combining feeds to and from antennas, antenna beam forming, providing taps for cable distributed systems such as cable TV, and separating transmitted and received signals on telephone lines. In general, directional couplers are four-port circuits where a defined amount of the electromagnetic power fed at the input port in a transmission line is coupled to a port (known as coupled port) and one port is isolated from the input port. One key feature of directional couplers is that they only couple power flowing in one direction.

Figure 1:
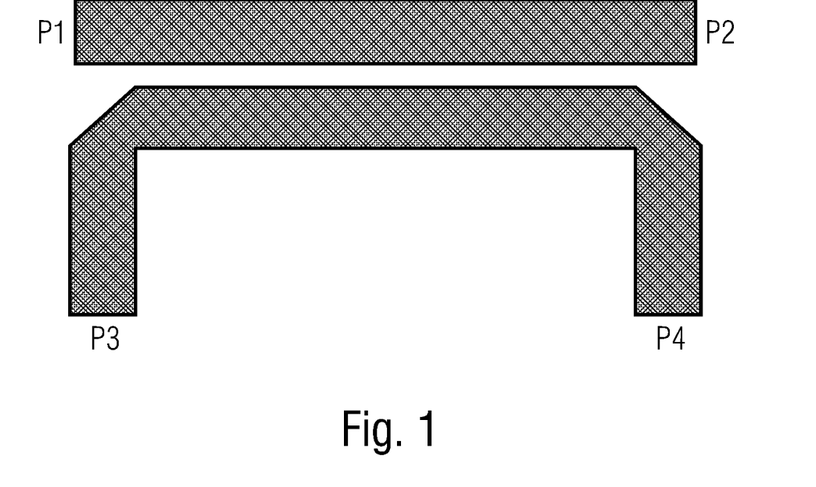
FIG. 1 shows a schematic diagram of a directional coupler, according to an example of a conventional directional coupler.

In the perfect case, a directional coupler is a 4-port as shown in FIG. 1, reciprocal, and loss free. (FIG. 1 shows a schematic diagram of a directional coupler, according to an example of a conventional directional coupler). It can be demonstrated as indicted below as a scattering (or S-) matrix (equation (0)), that such a component is directional, i.e. each port is coupled with two of the remaining ones and is isolated from the other one.

$$[S] = \begin{bmatrix} 0 & s_{12}=s_{21} & s_{13}=s_{31} & 0 \\ s_{12}=s_{21} & 0 & 0 & s_{24}=s_{42} \\ s_{13}=s_{31} & 0 & 0 & s_{34}=s_{43} \\ 0 & s_{24}=s_{42} & s_{34}=s_{43} & 0 \end{bmatrix} \quad \text{Equation (0)}$$

In the following, general properties of a directional coupler are explained by using the scattering matrix. An equation (1) indicates a generic 4-port network.

$$[S] = \begin{bmatrix} s_{11} & s_{12} & s_{13} & s_{14} \\ s_{21} & s_{22} & s_{23} & s_{24} \\ s_{31} & s_{32} & s_{33} & s_{34} \\ s_{41} & s_{42} & s_{43} & s_{44} \end{bmatrix} \quad \text{Equation (1)}$$

In case the perfect matched 4-port network ($s_{kk}=0$, k=1, . . . 4) of a directional coupler, it is indicated as an equation (2).

$$[S] = \begin{bmatrix} 0 & s_{12} & s_{13} & s_{14} \\ s_{21} & 0 & s_{23} & s_{24} \\ s_{31} & s_{32} & 0 & s_{34} \\ s_{41} & s_{42} & s_{43} & 0 \end{bmatrix} \quad \text{Equation (2)}$$

In case the reciprocal 4-port network ($s_{hk}=s_{kh}$, h, k=1, . . . 4) of a directional coupler, it is indicated as an equation (3).

$$[S] = \begin{bmatrix} s_{11} & s_{12} & s_{13} & s_{14} \\ s_{12} & s_{22} & s_{23} & s_{24} \\ s_{13} & s_{23} & s_{33} & s_{34} \\ s_{14} & s_{24} & s_{34} & s_{44} \end{bmatrix} \quad \text{Equation (3)}$$

In case the perfectly matched and reciprocal 4-port network ($s_{hk}=s_{kh}$, h, k=1, . . . 4 and $s_{hk}=s_{kh}$, h, k=1, . . . 4) of a directional coupler, i.e., the case combined the equation (2) and the equation (3), it is indicated by an equation (4).

$$[S] = \begin{bmatrix} 0 & s_{12} & s_{13} & s_{14} \\ s_{12} & 0 & s_{23} & s_{24} \\ s_{13} & s_{23} & 0 & s_{34} \\ s_{14} & s_{24} & s_{34} & 0 \end{bmatrix} \quad \text{Equation (4)}$$

Considering a condition on the scattering matrix for a loss-free N-port network, it is indicated as an equation (5), where [E] is the N×N unity matrix: the elements on the main diagonal equal to one, the remaining ones to zero.

$$[S] \cdot [S]^{T*} = [E] \quad \text{Equation (5)}$$

When the condition as indicated by the equation (5) applied to the equation (4), it is indicated by an equation (6) as below.

$$\begin{bmatrix} 0 & s_{12} & s_{13} & s_{14} \\ s_{12} & 0 & s_{23} & s_{24} \\ s_{13} & s_{23} & 0 & s_{34} \\ s_{14} & s_{24} & s_{34} & 0 \end{bmatrix} \cdot \begin{bmatrix} 0 & s_{12}^* & s_{13}^* & s_{14}^* \\ s_{12}^* & 0 & s_{23}^* & s_{24}^* \\ s_{13}^* & s_{23}^* & 0 & s_{34}^* \\ s_{14}^* & s_{24}^* & s_{34}^* & 0 \end{bmatrix} = \quad \text{Equation (6)}$$

$$\begin{bmatrix} s_{12} \cdot s_{12}^* + s_{13} \cdot s_{13}^* + s_{14} \cdot s_{14}^* & s_{13} \cdot s_{23}^* + s_{14} \cdot s_{24}^* & s_{12} \cdot s_{23}^* + s_{14} \cdot s_{34}^* & s_{12} \cdot s_{24}^* + s_{13} \cdot s_{34}^* \\ s_{23} \cdot s_{13}^* + s_{24} \cdot s_{14}^* & s_{12} \cdot s_{12}^* + s_{23} \cdot s_{23}^* + s_{24} \cdot s_{24}^* & s_{12} \cdot s_{13}^* + s_{24} \cdot s_{34}^* & s_{12} \cdot s_{14}^* + s_{23} \cdot s_{34}^* \\ s_{23} \cdot s_{12}^* + s_{34} \cdot s_{14}^* & s_{13} \cdot s_{12}^* + s_{34} \cdot s_{24}^* & s_{13} \cdot s_{13}^* + s_{23} \cdot s_{23}^* + s_{34} \cdot s_{34}^* & s_{13} \cdot s_{14}^* + s_{23} \cdot s_{24}^* \\ s_{24} \cdot s_{12}^* + s_{34} \cdot s_{13}^* & s_{14} \cdot s_{12}^* + s_{34} \cdot s_{23}^* & s_{14} \cdot s_{13}^* + s_{24} \cdot s_{23}^* & s_{14} \cdot s_{14}^* + s_{24} \cdot s_{24}^* + s_{34} \cdot s_{34}^* \end{bmatrix} =$$

$$\begin{bmatrix} 1 & 0 & 0 & 0 \\ 0 & 1 & 0 & 0 \\ 0 & 0 & 1 & 0 \\ 0 & 0 & 0 & 1 \end{bmatrix}$$

The equation (6) can be developed as indicated by an equation (7).

$$\begin{bmatrix} |s_{12}|^2+|s_{13}|^2+|s_{14}|^2 & s_{13}\cdot s_{23}^*+s_{14}\cdot s_{24}^* & s_{12}\cdot s_{23}^*+s_{14}\cdot s_{34}^* & s_{12}\cdot s_{24}^*+s_{13}\cdot s_{34}^* \\ s_{23}\cdot s_{13}^*+s_{24}\cdot s_{14}^* & |s_{12}|^2+|s_{23}|^2+|s_{24}|^2 & s_{12}\cdot s_{13}^*+s_{24}\cdot s_{34}^* & s_{12}\cdot s_{14}^*+s_{23}\cdot s_{34}^* \\ s_{23}\cdot s_{12}^*+s_{34}\cdot s_{14}^* & s_{13}\cdot s_{12}^*+s_{34}\cdot s_{24}^* & |s_{13}|^2+|s_{23}|^2+|s_{34}|^2 & s_{13}\cdot s_{14}^*+s_{23}\cdot s_{24}^* \\ s_{24}\cdot s_{12}^*+s_{34}\cdot s_{13}^* & s_{14}\cdot s_{12}^*+s_{34}\cdot s_{23}^* & s_{14}\cdot s_{13}^*+s_{24}\cdot s_{23}^* & |s_{14}|^2+|s_{24}|^2+|s_{34}|^2 \end{bmatrix} = \begin{bmatrix} 1 & 0 & 0 & 0 \\ 0 & 1 & 0 & 0 \\ 0 & 0 & 1 & 0 \\ 0 & 0 & 0 & 1 \end{bmatrix}$$ Equation (7)

The matrix element of the equation (6) corresponds to a system of 10 scalar equations, the first six are double but remaining equations are the conjugate of the matrix element. From the first one of them it follows that one between $s_{13}$, $s_{23}$ and $s_{14}$, $s_{24}$ must be zero. Since the choice of port numbering is arbitrary, it is possible to define $s_{14}=s_{23}=0$. Other solutions are possible, all of them imply that for two couples of values h1, k1 and h2, k2 it is $s_{h1k1}=s_{k1h1}=0$ and $s_{h2k2}=s_{k2h2}=0$: that directly follows from the fact that the choice of port numbering is arbitrary. This is indicated by an equation (8).

$s_{13}\cdot s^*_{23}+s_{14}\cdot s^*_{24}=s_{23}\cdot s^*_{13}+s_{24}\cdot s^*_{14}=0$ $s_{12}\cdot s^*_{23}+s_{14}\cdot s^*_{34}=s_{23}\cdot s^*_{12}+s_{34}\cdot s^*_{14}=0$ $s_{12}\cdot s^*_{24}+s_{13}\cdot s^*_{34}=s_{24}\cdot s^*_{12}+s_{34}\cdot s^*_{13}=0$ $s_{12}\cdot s^*_{13}+s_{24}\cdot s^*_{34}=s_{13}\cdot s^*_{12}+s_{34}\cdot s^*_{24}=0$ $s_{12}\cdot s^*_{14}+s_{23}\cdot s^*_{34}=s_{14}\cdot s^*_{12}+s_{34}\cdot s^*_{23}=0$ $s_{13}\cdot s^*_{14}+s_{23}\cdot s^*_{24}=s_{14}\cdot s^*_{13}+s_{24}\cdot s^*_{23}=0$ $|s_{12}|^2+|s_{13}|^2+|s_{14}|^2=1$ $|s_{12}|^2+|s_{23}|^2+|s_{24}|^2=1$ $|s_{13}|^2+|s_{23}|^2+|s_{34}|^2=1$ $|s_{14}|^2+|s_{24}|^2+|s_{34}|^2=1$ Equation (8)

With the assumptions in the equation (8), the 10 scalar equations are reduced to 4 as indicated as an equation (9).

$s_{12}\cdot s^*_{24}=-s_{13}\cdot s^*_{34}$ $s_{12}\cdot s^*_{13}=-s_{24}\cdot s^*_{34}$ $|s_{12}|^2+|s_{13}|^2=1$ $|s_{12}|^2+|s_{24}|^2=1$ $|s_{13}|^2+|s_{34}|^2=1$ $|s_{24}|^2+|s_{34}|^2=1$ Equation (9)

An equation (10) indicates that left and right hand side of the first equation of the equation (9) are divided by the corresponding parts of the second equation of the equation (9).

$$\frac{s^*_{24}}{s^*_{13}}=\frac{s_{13}}{s_{24}} \Rightarrow |s_{24}|^2=|s_{13}|^2$$ Equation (10)

Then, given the identity to the equation (10), from the third and sixth equations of the equation (9), it follows as indicated by an equation (11).

$|s_{34}|^2=|s_{12}|^2$ Equation (11)

From the last 4 equations of the equation (9) and the identities indicated by the equations (10) and (11), it follows that the expressions of the four (partially) independent transmission coefficients are, where the amplitude A as well as the arguments $\alpha$, $\beta$, $\gamma$, $\delta$, are real functions of the frequency. This is indicated by an equation (12).

$s_{12}=A\cdot e^{j\alpha}$ $s_{13}=\sqrt{1-A^2}\cdot e^{j\beta}$ $s_{34}=A\cdot e^{j\gamma}$ $s_{24}=\sqrt{1-A^2}\cdot e^{j\delta}$ Equation (12)

The solution-forms for the equation (12) together with the first two equations of the equation (9) lead to a phase relationship between $s_{13}$ and $s_{24}$ as indicated by an equation (13).

$$\begin{cases} e^{j\alpha}\cdot e^{-j\delta}=-e^{j\beta}\cdot e^{-j\gamma} \\ e^{j\alpha}\cdot e^{-j\beta}=-e^{j\delta}\cdot e^{-j\gamma} \end{cases} \Rightarrow \frac{e^{j\alpha}\cdot e^{-j\delta}}{e^{j\alpha}\cdot e^{-j\beta}}=$$ Equation (13)

$$\frac{e^{j\beta}\cdot e^{-j\gamma}}{e^{j\delta}\cdot e^{-j\gamma}} \Rightarrow e^{-j\cdot 2\cdot\delta}=e^{j\cdot 2\cdot\beta} \Rightarrow -\delta=\beta+k\cdot\pi$$

$$\begin{cases} e^{j\alpha}\cdot e^{-j\delta}=-e^{j\beta}\cdot e^{-j\gamma} \\ e^{j\alpha}\cdot e^{-j\beta}=-e^{j\delta}\cdot e^{-j\gamma} \end{cases} \Rightarrow \frac{e^{j\alpha}\cdot e^{-j\delta}}{e^{-j\alpha}\cdot e^{j\beta}}=$$

$$\frac{e^{j\beta}\cdot e^{-j\gamma}}{e^{-j\delta}\cdot e^{j\gamma}} \Rightarrow e^{j\cdot 2\cdot\alpha}\cdot e^{-j\cdot 2\cdot\delta}=e^{j\cdot 2\cdot\beta} \Rightarrow \alpha-\delta=\beta+k\cdot\pi$$

Scattering matrix of an ideal directional coupler is indicated by an equation (14). There is no transmission between ports 1 to 4 and 2 to 3: this is the reason to use the adjective "directional".

$$[S]=\begin{Bmatrix} 0 & A\cdot e^{j\alpha} & \sqrt{1-A^2}\cdot e^{j\beta} & 0 \\ A\cdot e^{j\alpha} & 0 & 0 & \sqrt{1-A^2}\cdot e^{j\delta} \\ \sqrt{1-A^2}\cdot e^{j\beta} & 0 & 0 & A\cdot e^{j\gamma} \\ 0 & \sqrt{1-A^2}\cdot e^{j\delta} & A\cdot e^{j\gamma} & 0 \end{Bmatrix}$$ Equation (14)

As already explained above, in a scattering matrix as indicated by an equation (15) of a real directional coupler, no matrix element is zero. There are transmissions from each port to any other ports, and reflection from any ports as well. Some electrical energy is converted to heat:

$|s_{12}|^2+|s_{13}|^2<1$ and $|s_{34}|^2+|s_{24}|^2<1$

The reciprocity is however maintained.

$$[S] = \begin{bmatrix} s_{11} & s_{12} & s_{13} & s_{14} \\ s_{12} & s_{22} & s_{23} & s_{24} \\ s_{13} & s_{23} & s_{33} & s_{34} \\ s_{14} & s_{24} & s_{34} & s_{44} \end{bmatrix} \quad \text{Equation (15)}$$

Regarding the directional coupling, some parameters are defined as follows.

| Definition | Parameter | Most relevant |
|---|---|---|
| Insertion-loss (direct path) | $-20 \cdot \log_{10}(|s_{12}|)$, $-20 \cdot \log_{10}(|s_{34}|)$ | $-20 \cdot \log_{10}(|s_{12}|)$ |
| Return-loss | $-20 \cdot \log_{10}(s_{kk})$, (k = 1, 2, 3, 4) | k = 1, 2 |
| Coupling | $-20 \cdot \log_{10}(|s_{13}/s_{12}|)$, $-20 \cdot \log_{10}(|s_{24}/s_{34}|)$ | |
| Directivity | $-20 \cdot \log_{10}(|s_{14}/s_{13}|)$, $-20 \cdot \log_{10}(|s_{23}/s_{24}|)$ | |

The coupling has a specified flatness within a specified frequency bandwidth. In the ideal case, the directivity is infinite, in practical cases, it ranges from a few dB to 40-50 dB, depending on the realization technology, frequency and bandwidth.

Accordingly, it is an object of the present application to provide an arrangement to improve a directivity of a directional coupler compared to the known directional coupler.

SUMMARY OF THE INVENTION

In accordance with embodiments of the present application, a directional coupler arrangement, comprising: a directional coupler comprising a direct path, e.g. between ports P1 and P2, and a first coupled port, e.g. a port P3, and a second coupled port, e.g. a port P4; wherein the second coupled port may be considered as an "isolated port" if only one signal direction of the direct path is considered; a compensation arrangement configured to provide a coupling, e.g. an additional coupling, in addition to the coupling which is present within the directional coupler, between signals, e.g. outcoming signals and/or ingoing signals, of the first coupled port and of the second coupled port; wherein the compensation arrangement is configured to improve a directivity, e.g. at least one port of the additional coupling with respect to a signal propagating through the direct path of the directional coupler, when compared to a directivity of the directional coupler by the coupling, e.g. the additional coupling, in addition to the coupling which is present within the directional coupler, between signals of the first coupled port and of the second coupled port. Accordingly, by adding the compensation arrangement, effects of the reflected signals are reduced, and, therefore, the directivity of the directional coupler is improved.

In a preferred embodiment, the compensation arrangement comprises: added coupling networks, wherein the added coupling network is respectively provided at the first and the second coupled port, and an added transmission network provided between the coupling networks, e.g. added transmission path between the added coupling networks, or an optimized switch which is configured to alternatively couple to the first and the second coupled port, e.g., the switch is configured to select an output signal from the first or the second coupled port. Accordingly, it is possible to easily configure the compensation arrangement by providing the added coupling networks and the added transmission network, or the optimized switch (smart switch) and increase the directivity of the directional coupler.

In accordance with the embodiments of the present application, the coupling network comprises: a circuit comprising any one of power dividers, an additional directional coupler, e.g. high directivity is not required, or a power splitter, which comprises passive (lumped or distributed) and/or active elements, wherein the directivity is improved by adjusting the circuit configuration and/or values of the passive and/or active elements, e.g. the directivity in a predetermined frequency sub-band is improved by changing the circuit configuration (to add/omit elements), i.e. mechanically tune, and/or element values, i.e. electrically tune, dependent on the coefficients of the directional coupler. Accordingly, the directivity in a predetermined frequency sub-band is sassily tuned by mechanically or electrically tunning the added coupling network.

In a preferred embodiment, the added transmission network comprises a transmission line, wherein the directivity is improved by adjusting a length of the transmission line, e.g. the directivity in a predetermined frequency sub-band is improved by determining the length of the transmission line, i.e. mechanically tune, dependent on the coefficients of the directional coupler and the coupling network. Alternatively, the added transmission network comprises a lumped element, e.g. capacitor or inductor, wherein the directivity is improved by adjusting value of the lumped element, e.g. the directivity in a predetermined frequency sub-band is improved by determining element value, i.e. electrically tune, dependent on the coefficients of the directional coupler and the coupling network. Accordingly, it is possible to increase the directivity of the directional coupler without modifying the configuration of the directional coupler, but mechanically and/or electrically tuning the compensation arrangement.

In a preferred embodiment of the present application, wherein the optimized switch comprises: a first switch port connected to the first coupled port, a second switch port connected to the second coupled port and a third switch port, wherein the switch is configured such that, in state in which the switch connects the first switch port with the third switch port, a cross-talk from the second switch port to the first switch port, or a crosstalk from the second switch port to the third switch port contributes to an increase of a directivity of the directional coupler arrangement, e.g. in that a cross talk signal coupled via an open path of the switch at least partially compensates a parasitic signal component, e.g. present at the first coupled port, originating from a non-ideal directivity of the directional coupler at the third switch port; and/or wherein the switch is configured such that, in state in which the switch connects the second switch port with the third switch port, a cross-talk from the first switch port to the second switch port, or a crosstalk from the first switch port to the third switch port contributes to an increase of a directivity of the directional coupler arrangement, e.g. in that a cross talk signal coupled via an open path of the switch at least partially compensates a parasitic signal component, e.g. present at the second coupled port, originating from a non-ideal directivity of the directional coupler at the third switch port. Accordingly, the directivity of the directional coupler is increased by utilizing the cross talk signal to compensate the parasitic signal.

In a preferred embodiment of the present application, a S-matrix of the switch, e.g. an open state crosstalk characteristic of the switch, is adapted to at least partially compensate a no-ideal directivity of the directional coupler. Accordingly, the directivity of the directional coupler is increased by adding a smart designed switch.

In accordance with embodiments of the present application, the optimized switch comprises: a first switch port connected to the first coupled port, a second switch port connected to the second coupled port and a third switch port, wherein the switch is configured to alternatively couple one of the coupled ports with an evaluation device, e.g. a receiver, and another one of the coupled ports with a termination, e.g. a matched impedance. Accordingly, it is possible to selectively improve the directivity of the directional coupler by changing the connected port using the switch. In a preferred embodiment, wherein the optimized switch comprises at least one single pole double throw switch, SPDT.

In accordance with embodiments of the present application, a method for operating a directional coupler arrangement, comprising: providing a directional coupler comprising a direct path, a first coupled port and a second coupled port; providing a compensation arrangement configured to provide a coupling between signals of the first coupled port and of the second coupled port; wherein the compensation arrangement is configured to improve a directivity when compared to a directivity of the directional coupler by the coupling. Accordingly, the directional couple is operated with the increased directivity.

In a preferred embodiment of the present application, wherein the compensation arrangement comprises: added coupling networks, wherein the added coupling network is respectively provided at the first and the second coupled port, and an added transmission network provided between the coupling networks, or an optimized switch which is configured to alternatively couple the first and the second coupled port. Accordingly, it is possible to operate the directional coupler with increased directivity by adding appropriate compensation arrangement.

In a preferred embodiment of the present application, wherein the coupling network comprises: a circuit comprising any one of power dividers, an additional directional coupler or a power splitter, which comprises passive and/or active elements, wherein the method further comprises adjusting the circuit configuration and/or values of the passive and/or active elements to improve the directivity. Accordingly, the directional coupler is operated to increase the directivity by electrically and/or mechanically adjusting the added coupling network.

In a preferred embodiment of the present application, wherein the added transmission network comprises a transmission line, wherein the method further comprises adjusting a length of the transmission line to improve the directivity. Alternatively, the added transmission network comprises a lumped element, wherein the method further comprises adjusting value of the lumped element to improve the directivity.

In a further preferred embodiment of the present application, the optimized switch comprises: a first switch port connected to the first coupled port, a second switch port connected to the second coupled port and a third switch port, wherein the method further comprises utilizing, in state in which the switch connects the first switch port with the third switch port, a cross-talk from the second switch port to the first switch port, or a crosstalk from the second switch port to the third switch port contributes to an increase of a directivity of the directional coupler arrangement, and/or wherein the method further comprises utilizing, in state in which the switch connects the second switch port with the third switch port, a cross-talk from the first switch port to the second switch port, or a crosstalk from the first switch port to the third switch port contributes to an increase of a directivity of the directional coupler arrangement. In a preferred embodiment of the present application, the method further comprises adapting a S-matrix of the switch to at least partially compensate a no-ideal directivity of the directional coupler. Accordingly, it is possible to operate the directional coupler with increased directivity by utilizing the cross-talk signal to suppress signals to affect the directivity.

In a preferred embodiment of the present application, wherein the optimized switch comprises: a first switch port connected to the first coupled port, a second switch port connected to the second coupled port and a third switch port, wherein the method further comprises to alternatively coupling one of the coupled ports with an evaluation device and another one of the coupled ports with a termination. Accordingly, it is easily select the output signal, i.e. an incident (delivered) signal or reflected signal, by using the optimized switch without decreasing the directivity of the directional coupler.

BRIEF DESCRIPTION OF THE FIGURES

Embodiments according to the invention will subsequently be described taking reference to the enclosed figures in which.

DETAILED DESCRIPTION OF THE EMBODIMENTS

Figure 2:
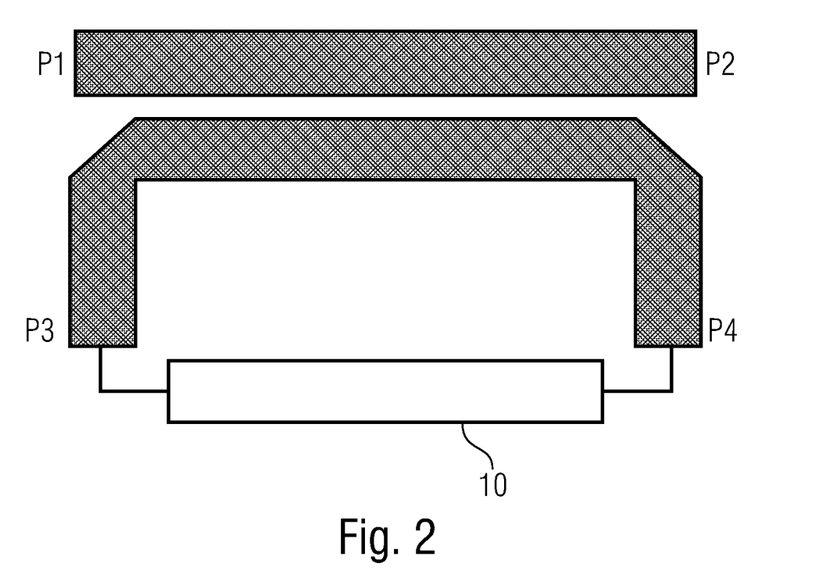
FIG. 2 shows a schematic diagram of a directional coupler, according to an embodiment of the present application.

FIG. 2 shows a schematic diagram of a directional coupler according to an embodiment of the present application. As indicated in FIG. 2, the directional coupler comprising a direct path between ports P1 and P2, a first coupled port P3, and a second coupled port P4, and a compensation arrangement 10. In case only one signal direction of the direct path is considered, the port P1 may be an input port, the port P2 may be an output port, the first coupled port P3 may be a coupled port and the second coupled port P4 may be an isolated port. The compensation arrangement 10 is configured to provide a coupling, i.e., an additional coupling, in addition to the coupling which is present within the directional coupler, between signals, i.e., outcoming signals and/or incoming signals, of the first coupled port and of the second coupled port.

Figure 3:
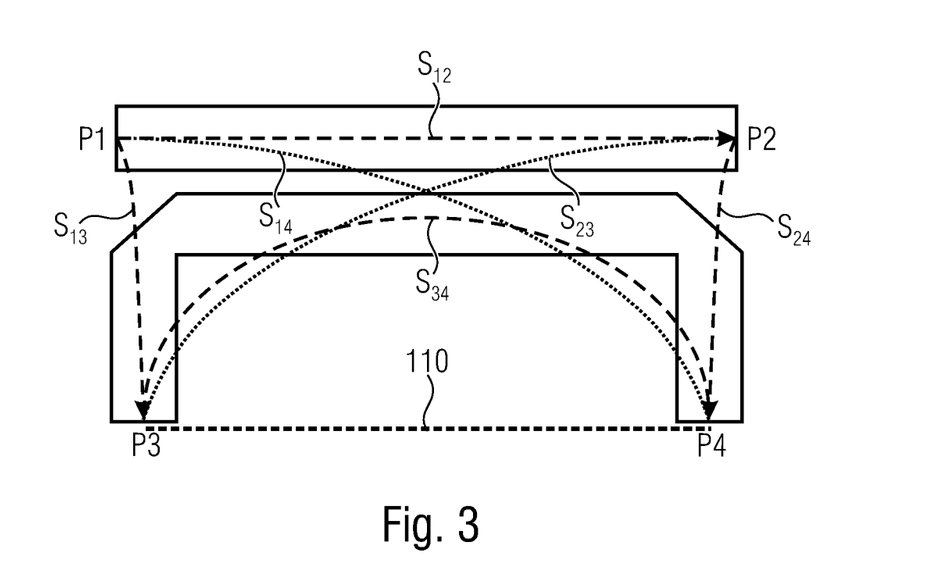
FIG. 3 shows a schematic illustration of the directional coupler, according to the embodiment of the present application.

As indicated in FIG. 2, by providing the compensation arrangement 10 to the directional coupler, the directivity of the directional coupler is increased. FIG. 3 shows a schematic diagram of the directional coupler to describe the compensation function of the compensation arrangement. The directional coupler arrangement indicated in FIG. 3 comprises a directional coupler comprising a direct path between the ports P1 and P2, a coupled path between the first and the second coupling ports P3 and P4, and a compensation arrangement, i.e., an added path 110 between the first and the second coupling ports P3 and P4. When signals are input to the port P1 (or the port P2), reflected signals (unwanted signals) are transmitted together with delivered signals (incident or wanted signals), and high directivity is acquired by reducing the reflected signals. The unwanted signals are indicated by the dot line in FIG. 3 and the wanted signals are indicated by the dashed line in FIG. 3. The unwanted signal between the port P2 and the first coupled port P3 has a coefficient S23, and the unwanted signal between the port P1 and the second coupled port P4 has a coefficient S14. The wanted signal between the port P1 and the port P2 has a coefficient S12, the wanted signal between the port P1 and the first coupled port P3 has a coefficient S13, the wanted signal between the port P2 and the second coupled port P4 has a coefficient S24, and the wanted signal between the first and the second coupled ports P3, P4 has a coefficient S34. Therefore, the compensation arrangement (added path) 110 has a proper amplitude and phase in order to increase a directivity of the directional coupler, i.e., to cancel (kill) the unwanted transmission coefficients (S14, S23) by means of injection of the wanted ones (S13, S34).

Figure 4:
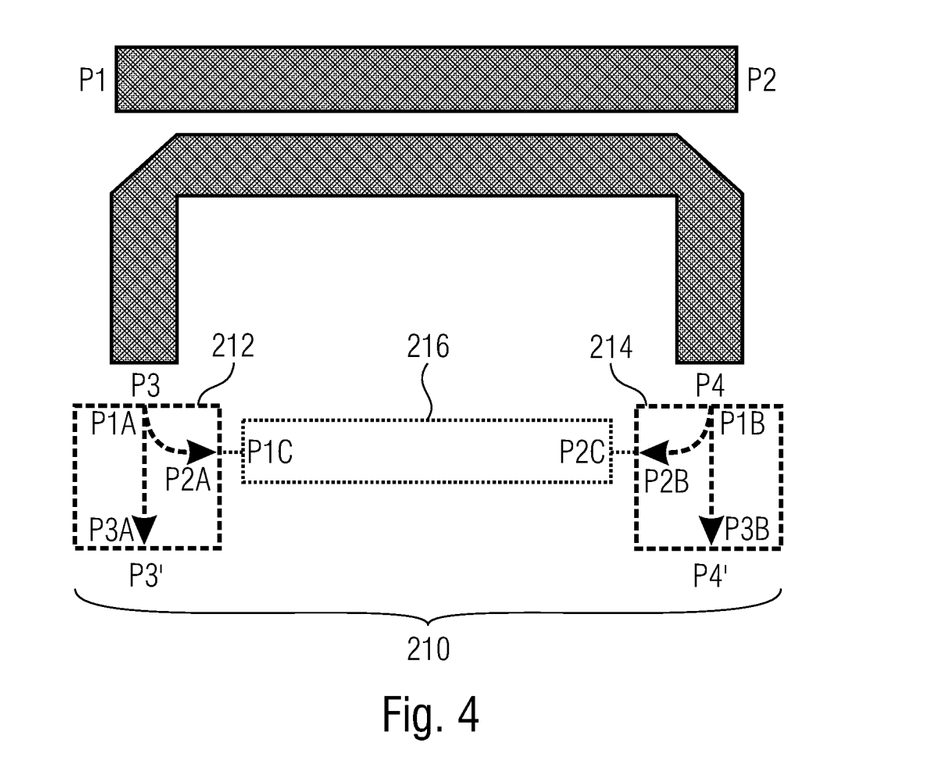
FIG. 4 shows a schematic diagram of a directional coupler, according to another embodiment of the present application.

FIG. 4 shows a schematic diagram of a directional coupler, according to another embodiment of the present application, i.e., in FIG. 4, an example of implemented directional coupler arrangement of the present application is indicated. As indicated in FIG. 4, a compensation arrangement 210 comprises two added coupling networks 212, 214, and an added transmission line 216. Having the configuration as indicated in FIG. 4, at least one port P3' or P4' with respect to a signal propagates through the direct path of the directional coupler, and, therefore, the directivity of the directional coupler is improved.

Each of the added coupling networks 212, 214 comprise a circuit of a three-port network, e.g., power dividers or additional directional coupler (high directivity is not required) or power splitter. In addition, the coupling network comprises passive (lumped or distributed) components or active components or combination of the passive and active components. The directivity of the directional coupler is improved by adjusting the circuit configuration or values of the circuit components or both of the circuit configuration and the values of the circuit components depended on the coefficients of the directional coupler. That is, the directivity in a predetermined frequency sub-band is improved by changing the circuit configuration (to add/omit circuit component/element), i.e. mechanically tune, and/or changing the element/component values, i.e. electrically tune, dependent on the coefficients of the directional coupler.

The added transmission network could be a single transmission line or a lamped element (capacitor or inductor) in the simplest case. More in general, the added transmission network could be a two-port network with specified scattering matrix to be determined in conjunction with the ones of the directional coupler and coupling network.

Figure 5:
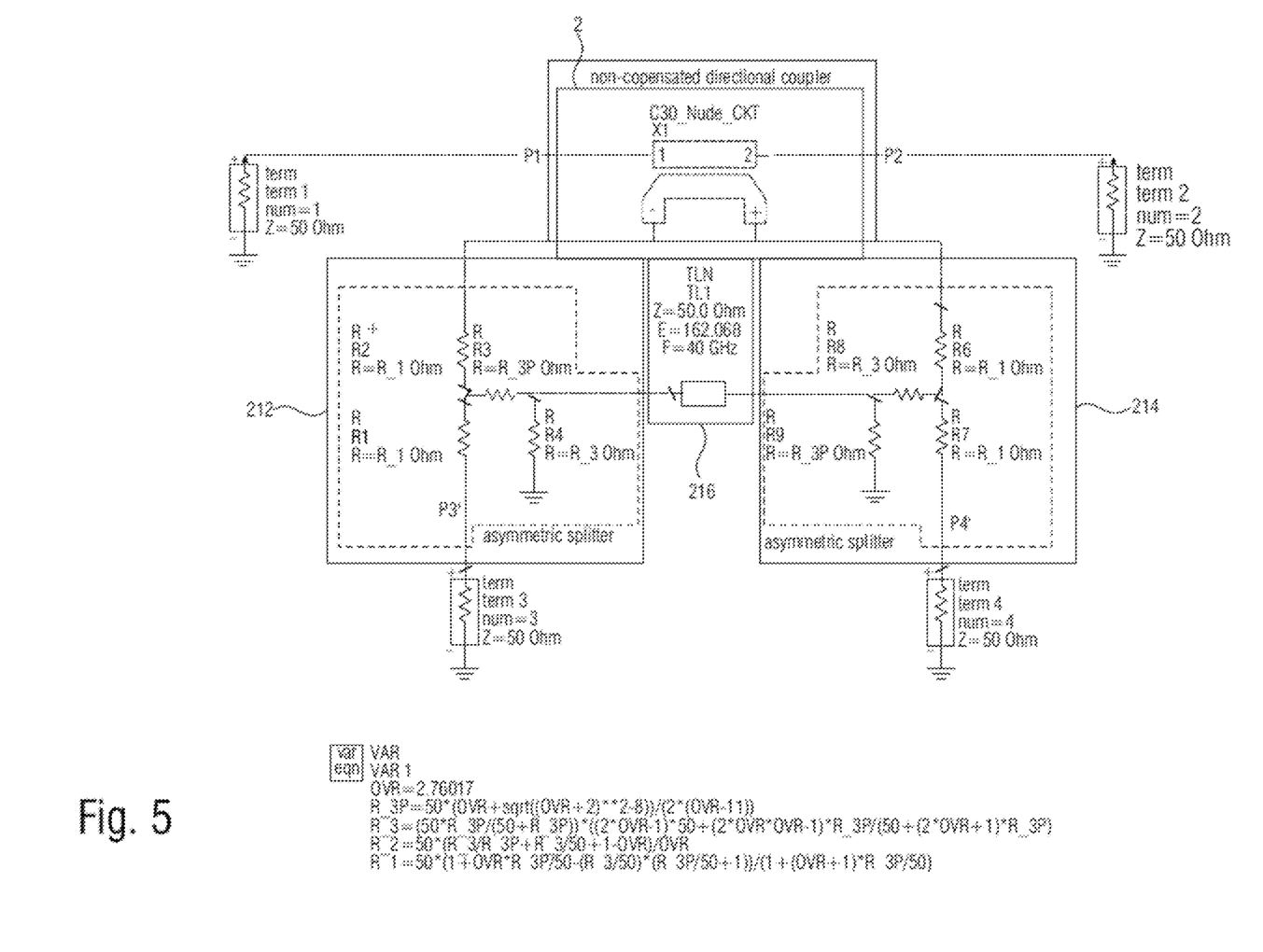
FIG. 5 shows a schematic block diagram of the directional coupler, according to another embodiment of the present application.

FIG. 5 shows a schematic diagram of an implementation sample of the directional coupler arrangement according to the present application. As indicated in FIG. 5, the directional coupler arrangement comprises a directional coupler 2, the added coupling networks 212, 214 and the added transmission network 216. In the implementation sample of FIG. 5, asymmetric splitter is used as the added coupling network. The configuration and components of the splitter are determined based on the coefficients of the directional coupler 2. In the same manner, the length of the transmission line or the value of the lamped element of the transmission network 216 has been adjusted dependent on the coefficients of the directional coupler and the added coupling network.

Figure 6:
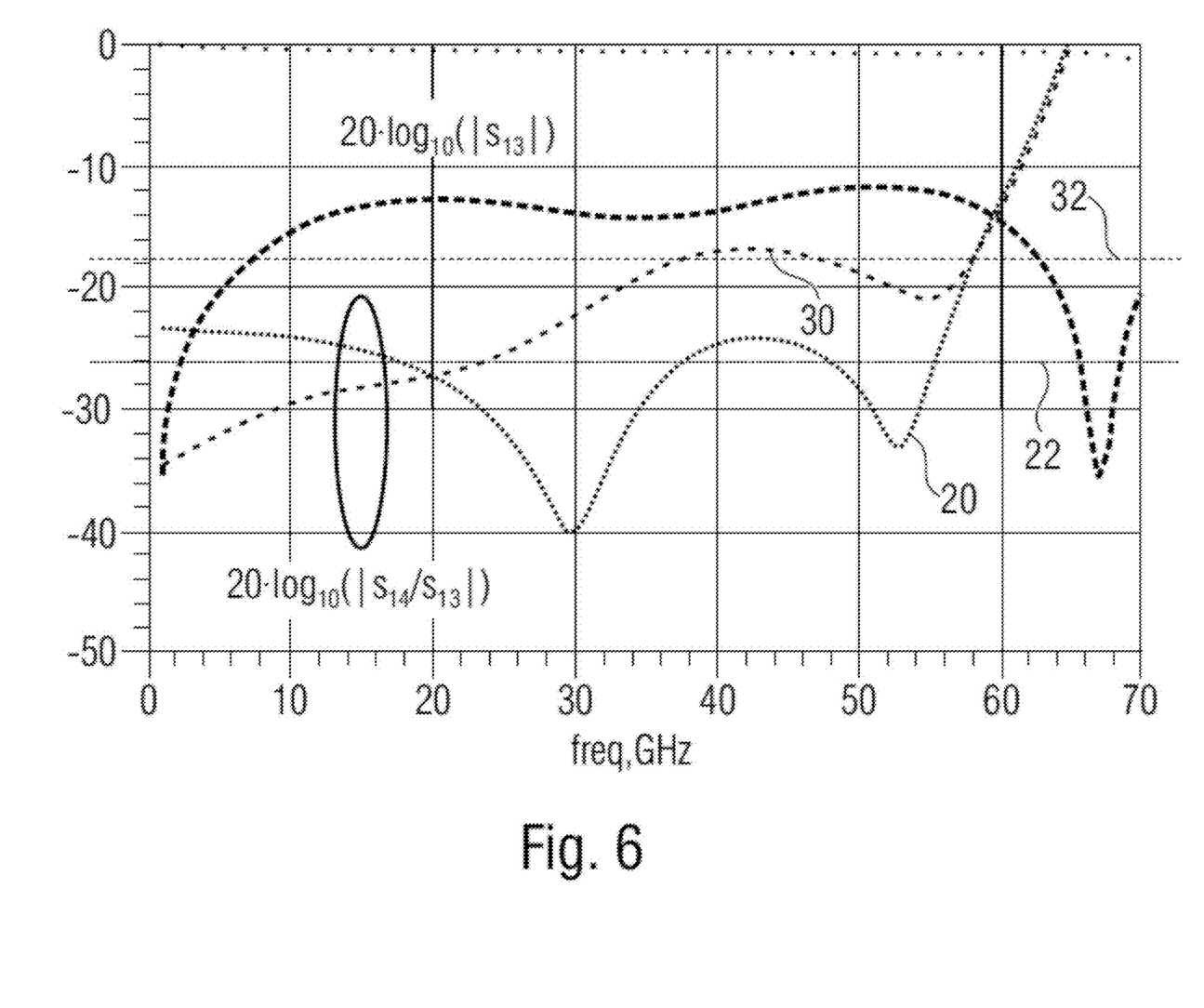
FIG. 6 shows a graph indicating an improvement of the directivity of the directional coupler, according to the embodiment of the present application.

FIG. 6 shows a graph indicating an improvement of the directivity of the directional coupler according to the embodiment of the present application. As depicted in FIG. 6, a result of a directional coupler with a compensation arrangement is indicated by a line 20 and a result of a directional coupler without a compensation arrangement is indicated by a dot line 30. The graph indicated by dashed line shows a return loss between the port P1 and the first coupling port P3. As already indicated in the above mentioned table, the directivity is indicated $-20 \cdot \log_{10}(|s_{14}/s_{13}|)$. A directivity of the directional coupler with the compensation arrangement is indicated by a line 22, i.e., approximately −24 dB, and a directivity of the directional coupler without the compensation arrangement is indicated by a line 32, i.e., approximately −16 dB, i.e., the directivity of the directional coupler is approximately 8 dB improved by providing the compensation arrangement.

Figure 7:
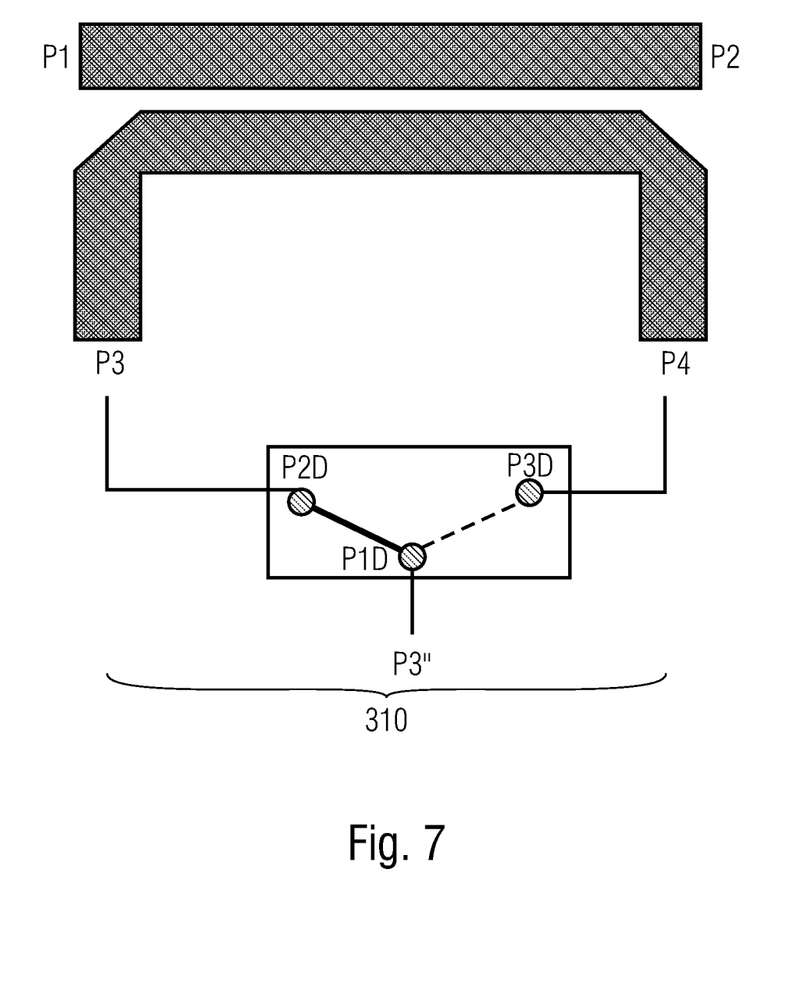
FIG. 7 shows a schematic diagram of a directional coupler, according to a further embodiment of the present application.

FIG. 7 shows a schematic diagram of a directional coupler according to a further embodiment of the present application. As indicated in FIG. 7, a directional coupler arrangement according to this embodiment includes an optimized switch as the compensation arrangement 310. The optimized switch 310 comprises a first switch port P2D connected to the first coupled port P3, a second switch port P3D connected to the second coupled port P4 and a third switch port P3". In the general case, the limited isolation (cross-talk) between the first switch port P2D and the second switch port P3D further reduces the directivity. The optimized switch 310 is designed in combination with the known scattering matrix of the directional coupler, i.e., the scattering parameter $s_{23}$ with the proper amplitude and phase. In this embodiment, a single pole double throw switch, SPDT, is used as the optimized switch, and the SPDT is configured to work as the compensation arrangement, i.e. increase the directivity by a controlled injection of signal.

In detail, the switch 310 is configured such that, in state in which the switch connects the first switch port P2D with the third switch port P3", a cross-talk from the second switch port P3D to the first switch port P2D, or a crosstalk from the second switch port P3D to the third switch port P3" contributes to an increase of a directivity of the directional coupler arrangement, e.g. in that a cross talk signal coupled via an open path of the switch at least partially compensates a parasitic signal component, e.g. present at the first coupled port P3, originating from a non-ideal directivity of the directional coupler at the third switch port P3". In addition, or alternatively, the switch 310 is configured such that, in state in which the switch connects the second switch port P3D with the third switch port P3", a cross-talk from the first switch port P2D to the second switch port P3D, or a crosstalk from the first switch port P2D to the third switch port P3" contributes to an increase of a directivity of the directional coupler arrangement, e.g. in that a cross talk signal coupled via an open path of the switch at least partially compensates a parasitic signal component, e.g. present at the second coupled port P4, originating from a non-ideal directivity of the directional coupler at the third switch port P3". That is, the switch, SPDT, of this embodiment has one common RF port and two selectable RF ports, and the SPDT is designed to properly and simultaneously operate.

Figure 8:
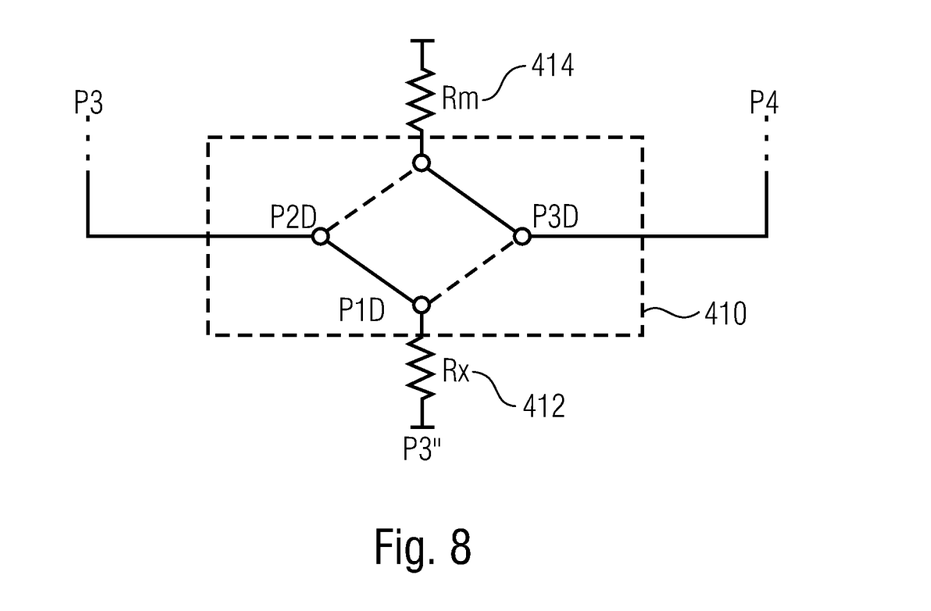
FIG. 8 shows an example of a schematic diagram of a switch as a compensation arrangement, according to a different embodiment of the present application.

FIG. 8 shows one of possible options of a schematic diagram of a switch as a compensation arrangement according to a different embodiment of the present invention, i.e., the optimized switch having a different configuration is depicted in FIG. 8. That is, in this embodiment, the optimized switch 410 is provided to the directional coupler instead of the optimized switch 310 of FIG. 7. The optimized switch 410 comprises a first switch port P2D connected to the first coupled port P3, a second switch port P3D connected to the second coupled port P4 and a third switch port P3". In the compensation arrangement of this embodiment may further comprises a receiver 412 and a termination 414.

The switch 410 is configured to alternatively couple one of the coupled ports P3, P4 with an evaluation device, e.g. a receiver Rx and another one of the coupled ports P3, P4 with a termination, e.g. a matched impedance Rm. In case a generator is connected to the port P1 (P2), a load to the port P2 (P1) and a receiver RX to the third switch port P3", with the optimized switch, i.e., the SPDT, in position to connect the first switch port P2D and the third switch port P3", the receiver 412, i.e., Rx receives a signal proportional to the one delivered to (reflected from) the load, and the second switch port P3D is coupled with the termination 414, i.e., Rm. In case a generator is connected to the port P1 (P2), a load to the port P2 (P1) and the receiver Rx to P3", with the optimized switch, i.e., the SPDT, in position to connect the second switch port P3D to the third switch port P3", the receiver Rx receives a signal proportional to the one reflected from (delivered to) the load, and the first switch port P2D is coupled with the termination Rm. That is, the first and second coupled ports P3, P4 are closed on a matched impedance for any position of the switch, i.e., the switch is alternatively couple one of the coupled ports with an evaluation device (Rx) 412 and another one of the coupled ports with a termination (Rm) 414. The optimized switch 410 is also designed in combination with the known scattering matrix of the directional coupler, i.e., the scattering parameter $s_{23}$ with the proper amplitude und phase in the same manner as the optimized switch 310 of FIG. 7.

As already mentioned above, the SPDT must be absorptive, i.e., the first and second coupled ports P3 and P4 have to see a matched impedance independently from the selected port to the third switch port P3" (P3 or P4). There are many ways to realize or implement the required absorptive SPDT, and another example is shown in FIG. 9.

Figure 9:
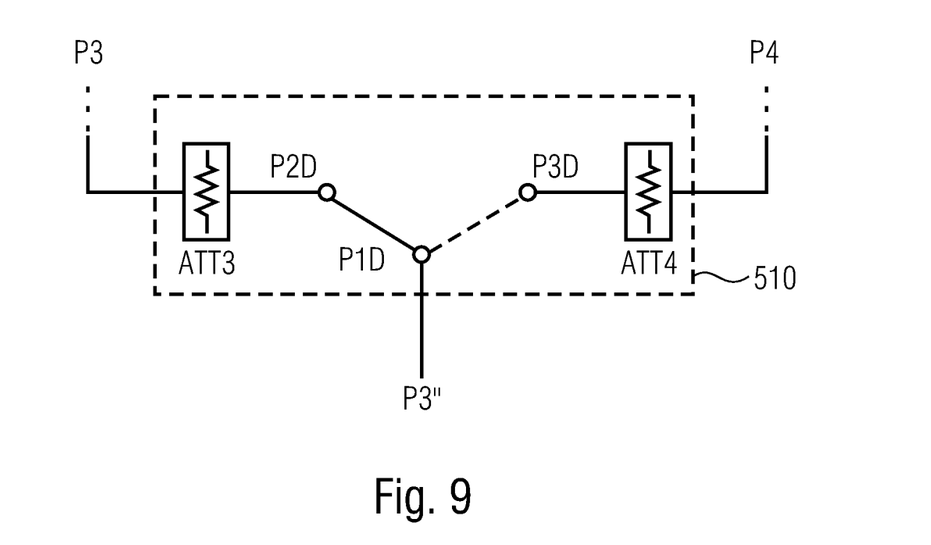
FIG. 9 shows another example of a schematic diagram of a switch as a compensation arrangement, according to a different embodiment of the present application.

As indicated in FIG. 9, a switch 510 (the optimized switch 510) comprises two attenuators ATT3 and ATT4. A reasonable attenuation for the two attenuators ATT3 and ATT4 could be three to ten dB, but this condition could be changed dependent on a configuration and required characteristics of the directional coupler. The two attenuators ATT3 and ATT4 provide reasonable impedance matching to the first and second coupled ports P3 and P4, independently from the selected one. This switch configuration is simpler than the switch configuration of FIG. 8. However, when the condition, the first and second coupled ports P3 and P4 see matched impedance, whichever port is connected to the third switch port P3", is fulfilled, any other switch configurations are acceptable. That is, there are many possible ways to implement the optimized switch to fulfil the requirements of matched impedance between the first and second ports P3 and P4 depends on required conditions, e.g., a size, complexity, performance, price, stability and one or more of combination of them. The optimized switch 510 is also designed in combination with the known scattering matrix of the directional coupler, i.e., the scattering parameter $s_{23}$ with the proper amplitude und phase.

As mentioned above, there are many possible arrangements of the optimized switch and the implementation arrangements of the optimized switch are not limited above mentioned examples.

Figure 10:
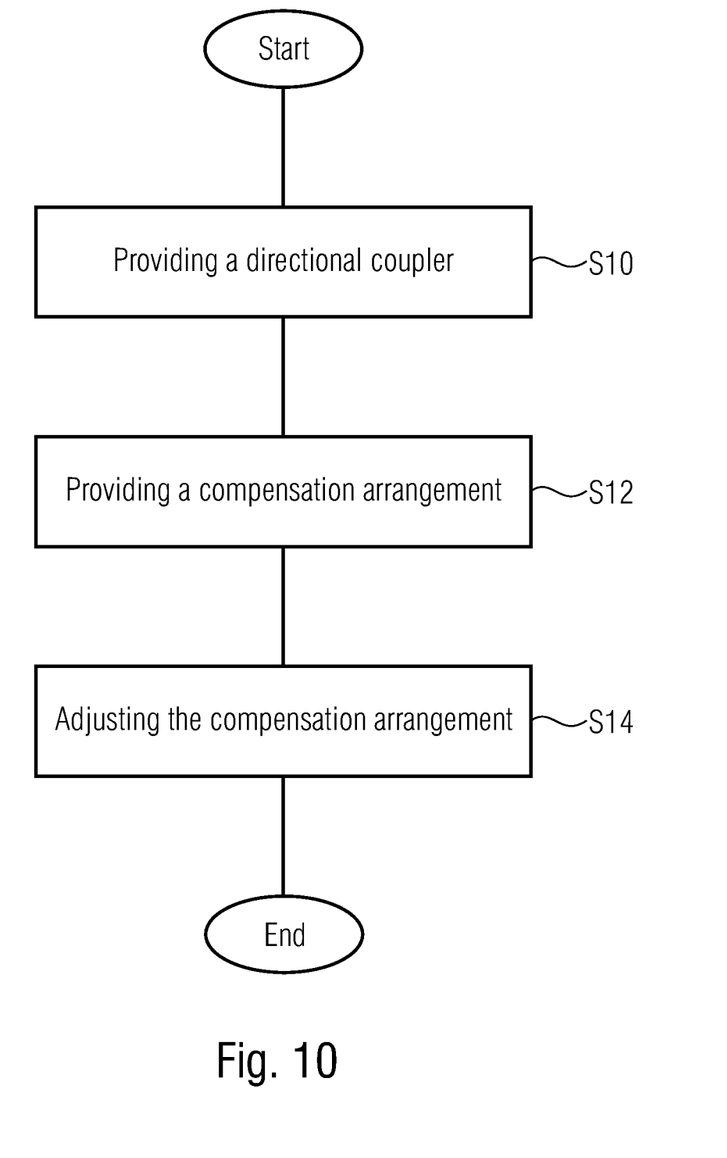
FIG. 10 shows a flowchart of a method for operating a directional coupler arrangement, according to an embodiment of the present application.

FIG. 10 shows a flowchart of a method for operating a directional coupler arrangement, according to an embodiment of the present application. As indicated in FIG. 10, a directional coupler is provided (S10), i.e., the directional coupler as indicated in FIG. 1 is provided. A compensation arrangement is provided to the directional coupler (S12), e.g., as indicated in FIG. 2. The compensation arrangement may be, for example, added coupling networks and an added transmission line, and they are provided to the directional coupler as indicated in FIG. 4. A directivity of the directional coupler is able to further improve by electrically and/or mechanically tuning the compensation arrangement, i.e., by adjusting a configuration of a circuit of the added coupling network, and/or, a length or value of the transmission line.

Figure 11:
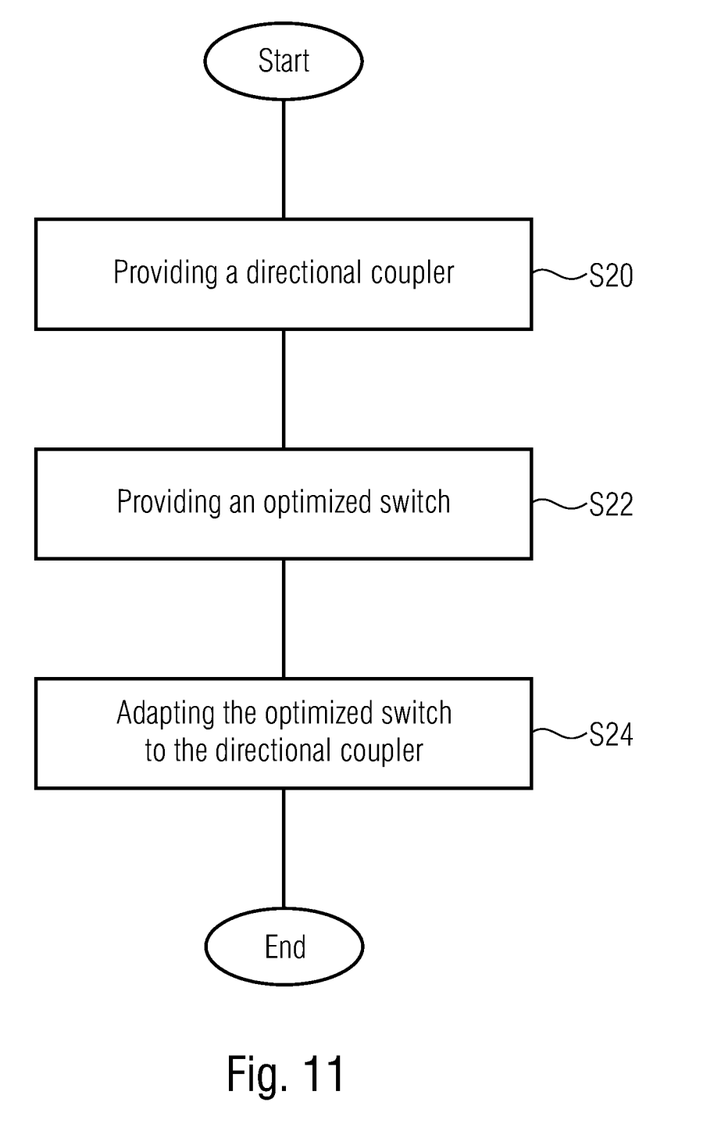
FIG. 11 shows a flowchart of a method for operating a directional coupler arrangement, according to another embodiment of the present application.

FIG. 11 shows a flowchart of a method for operating a directional coupler arrangement, according to another embodiment of the present application. As indicated in FIG. 11, a directional coupler is provided (S20), i.e., the directional coupler as indicated in FIG. 1 is provided. A compensation arrangement is provided to the directional coupler (S22) as indicated in FIG. 2, for example, an optimized switch is provided to the directional coupler as indicated in FIG. 7. Then, the optimized switch is adapted to the directional coupler, i.e., utilizing a cross-talk for contributing to increase of a directivity of the directional coupler, or, adapting a S-matrix of the switch (S24). In case the S-matrix of the switch is adapted, i.e., the transmission coefficient between the first coupled port P3 and the second coupled port P4 with the proper amplitude and phase, the switch alternatively coupling one of the coupled ports with an evaluation device and another one of the coupled ports with a termination as indicated in FIG. 8. Alternatively, the optimized switch could have another configuration as indicated in FIG. 8, i.e., the configuration of FIG. 9

Implementation Alternatives

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The invention claimed is:

1. An apparatus comprising:
a directional coupler comprising:
a first coupled port;
a second coupled port;
a direct path between two ports; and
a compensation circuit configured to selectively provide coupling between signals of the first coupled port or of the second coupled port, wherein the compensation circuit comprises a switch comprising:
a first switch port coupled to the first coupled port;
a second switch port coupled to the second coupled port; and
a third switch port operable to output signals between the first switch port and the second switch port to improve a directivity of the directional coupler with respect to the direct path as compared to a directivity of the directional coupler by the coupling, wherein the switch comprises a single pole double throw switch operable to facilitate directivity of the directional coupler by providing crosstalk between the first switch port and the second switch port using a controlled injection of signal to the directional coupler that substantially cancels unwanted signal coefficients, and wherein an amplitude and phase of signals provided by the switch is configured based on a scattering matrix of the directional coupler.

2. The apparatus according to claim 1,
wherein a state in which the switch connects the first switch port with the third switch port, a crosstalk from the second switch port to the first switch port, or a crosstalk from the second switch port to the third switch port contributes to an increase of the directivity of the directional coupler; and
wherein a state in which the switch connects the second switch port with the third switch port, a crosstalk from the first switch port to the second switch port, or a crosstalk from the first switch port to the third switch port contributes to the increase of the directivity of the directional coupler.

3. The apparatus according to claim 1, wherein the switch is configured to alternatively couple one of the first or second coupled ports with an evaluation device and another one of the first or second coupled ports with a termination.

4. An apparatus comprising:
a directional coupler comprising: a first coupled port; a second coupled port; and a direct path between a first port and a second port; and
a compensation circuit configured to provide coupling between signals of the first coupled port or of the second coupled port,
wherein the compensation circuit comprises a switch configured to alternatively couple between the first coupled port and the second coupled port to improve a directivity of the directional coupler via the direct path as compared to a directivity of the directional coupler by the coupling, and wherein the switch comprises at least one single pole double throw (SPDT) switch operable to facilitate directivity of the directional coupler by providing crosstalk between the first coupled port and the second coupled port using a controlled injection of signal to the directional coupler that substantially cancels unwanted signal coefficients, and wherein an amplitude and phase of signals provided by the switch is configured based on a scattering matrix of the directional coupler.

5. A method for operating a directional coupler circuit, comprising:
providing a directional coupler: comprising a direct path; a first coupled port; and
a second coupled port; and
providing selective coupling between signals of the first coupled port or of the second coupled port using a compensation circuit, and
wherein the compensation circuit comprises a switch comprising:
a first switch port coupled to the first coupled port;
a second switch port coupled to the second coupled port; and
a third switch port operable to output signals between the first switch port and the second switch port to improve a directivity by the direct path when compared to a directivity of the directional coupler by the coupling, wherein the switch comprises a single pole double throw switch operable to facilitate directivity of the directional coupler by providing crosstalk between the first switch port and the second switch port using a controlled injection of signal to the directional coupler that substantially cancels unwanted signal coefficients, and wherein an amplitude and phase of signals provided by the switch is configured based on a scattering matrix of the directional coupler.

6. The method according to claim 5, further comprising:
utilizing, in a state in which the switch connects the first switch port with the third switch port, a crosstalk from the second switch port to the first switch port, or a crosstalk from the second switch port to the third switch port, wherein the crosstalk contributes to an increase of the directivity of the directional coupler and;
utilizing, in a state in which the switch connects the second switch port with the third switch port, a crosstalk from the first switch port to the second switch port, or a crosstalk from the first switch port to the third switch port, wherein the crosstalk contributes to the increase of the directivity of the directional coupler.

7. The method according to claim 5,
further comprising alternatively coupling one of the coupled ports with an evaluation device and another one of the coupled ports with a termination.

* * * * *